US010529571B1

(12) United States Patent
Chang et al.

(10) Patent No.: US 10,529,571 B1
(45) Date of Patent: Jan. 7, 2020

(54) METHOD OF FABRICATING PATTERNED STRUCTURE

(71) Applicant: UNITED MICROELECTRONICS CORP., Hsin-Chu (TW)

(72) Inventors: Feng-Yi Chang, Tainan (TW); Fu-Che Lee, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/262,913

(22) Filed: Jan. 31, 2019

(30) Foreign Application Priority Data

Jan. 2, 2019 (CN) .......................... 2019 1 0001194

(51) Int. Cl.
*H01L 21/308* (2006.01)
*H01L 21/033* (2006.01)
*H01L 21/3213* (2006.01)

(52) U.S. Cl.
CPC ...... *H01L 21/0337* (2013.01); *H01L 21/3086* (2013.01); *H01L 21/32139* (2013.01)

(58) Field of Classification Search
None
See application file for complete search history.

(56) References Cited

U.S. PATENT DOCUMENTS

| | | | | |
|---|---|---|---|---|
| 9,378,973 | B1* | 6/2016 | Tung | H01L 21/823412 |
| 10,037,915 | B1* | 7/2018 | Hsu | H01L 21/823418 |
| 2018/0129773 | A1* | 5/2018 | Park | H01L 27/0207 |
| 2019/0181014 | A1* | 6/2019 | Chang | H01L 21/823468 |

OTHER PUBLICATIONS

Chang, Title of Invention: Layout of Semiconductor Structure, Semiconductor Device and Method of Forming the Same, U.S. Appl. No. 15/857,642, filed Dec. 29, 2017.

* cited by examiner

*Primary Examiner* — Shamim Ahmed
(74) *Attorney, Agent, or Firm* — Winston Hsu (57) ABSTRACT

A method of fabricating a patterned structure includes the following steps. A pattern transfer layer is formed on a material layer. The pattern transfer layer is formed above a first region and a second region. First patterns are formed on the pattern transfer layer. A mask layer is formed. A first part of the mask layer covers the first patterns above the first region. A first cap layer is formed covering the first part of the mask layer and the first patterns above the second region. The first cap layer covering the first part of the mask layer is removed for exposing the first part of the mask layer. The first part of the mask layer is removed. A first etching process is performed to the pattern transfer layer with the first patterns above the first region as a mask after removing the first part of the mask layer.

19 Claims, 10 Drawing Sheets

METHOD OF FABRICATING PATTERNED STRUCTURE

BACKGROUND OF THE INVENTION

1. Field of the Invention

The present invention relates to a method of fabricating a patterned structure, and more particularly, to a method of fabricating a patterned structure by a pattern transfer layer and an etching process.

2. Description of the Prior Art

Integrated circuit (IC) is constructed by devices and interconnections, which are formed by patterned feature in the substrate or different layers. In the fabrication of IC, the photolithography process is an essential technique. The photolithography process is configured to form designed patterns such as circuit layout patterns on one or more photomasks, and then to precisely transfer such patterns to a photoresist layer on a film by exposure and development steps. Subsequently, the complicated layout patterns are precisely transferred to a semiconductor chip.

With the miniaturization development in the semiconductor industry and the progress in semiconductor fabrication technology, the widely used conventional exposure techniques are gradually approaching their limits. Therefore, at present, the industry has also developed multiple exposure lithography technology to make more miniaturized semiconductor device structure. However, because the density of the patterned structures in the semiconductor device to be formed increases continuously, there are many manufacturing issues in the multiple exposure lithography technology have to be solved for improving the manufacturing yield.

SUMMARY OF THE INVENTION

A method of fabricating a patterned structure is provided in the present invention. A mask layer is applied for covering first patterns above a first region wherein an etching process is going to be performed subsequently. A first cap layer is formed cover the mask layer and the first patterns above a second region. The etching process is performed with the first patterns above the first region as a mask after removing the first cap layer above the first region and the mask layer above the first region. By the manufacturing method of the present invention, negative influence of material residues of the mask layer remaining between the first patterns above the first region on the etching process when the mask layer is formed only on the second region that is not supposed to be etched by the etching process may be avoided. The manufacturing yield may be improved accordingly.

According to an embodiment of the present invention, a method of fabricating a patterned structure is provided. The method includes the following steps. First, a pattern transfer layer is formed on a material layer. A first region and a second region are defined on the material layer, and the pattern transfer layer is formed above the first region and the second region. A plurality of first patterns is formed on the pattern transfer layer. The first patterns are formed above the first region and the second region. A mask layer is formed, and a first part of the mask layer covers the first patterns above the first region. A first cap layer is formed, and the first cap layer covers the first part of the mask layer above the first region and the first patterns above the second region. The first cap layer covering the first part of the mask layer is removed for exposing the first part of the mask layer above the first region. The first part of the mask layer is removed. A first etching process is performed to the pattern transfer layer with the first patterns above the first region as a mask after removing the first part of the mask layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-11 are schematic drawings illustrating a method of fabricating a patterned structure according to a first embodiment of the present invention, wherein

FIGS. 12-15 are schematic drawings illustrating a method of fabricating a patterned structure according to a second embodiment of the present invention, wherein

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The term "etch" is used herein to describe the process of patterning a material layer so that at least a portion of the material layer after etching is retained. For example, it is to be understood that the method of etching silicon involves patterning a photoresist layer over silicon and then removing silicon from the area that is not protected by the photoresist layer. Thus, after the etching process is complete, the silicon protected by the area of the photoresist layer will remain. In another example, the term "etch" may also refer to a method that does not use a photoresist, but leaves at least a portion of the material layer after the etch process is complete.

The above description may be used to distinguish between "etching" and "removal". When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
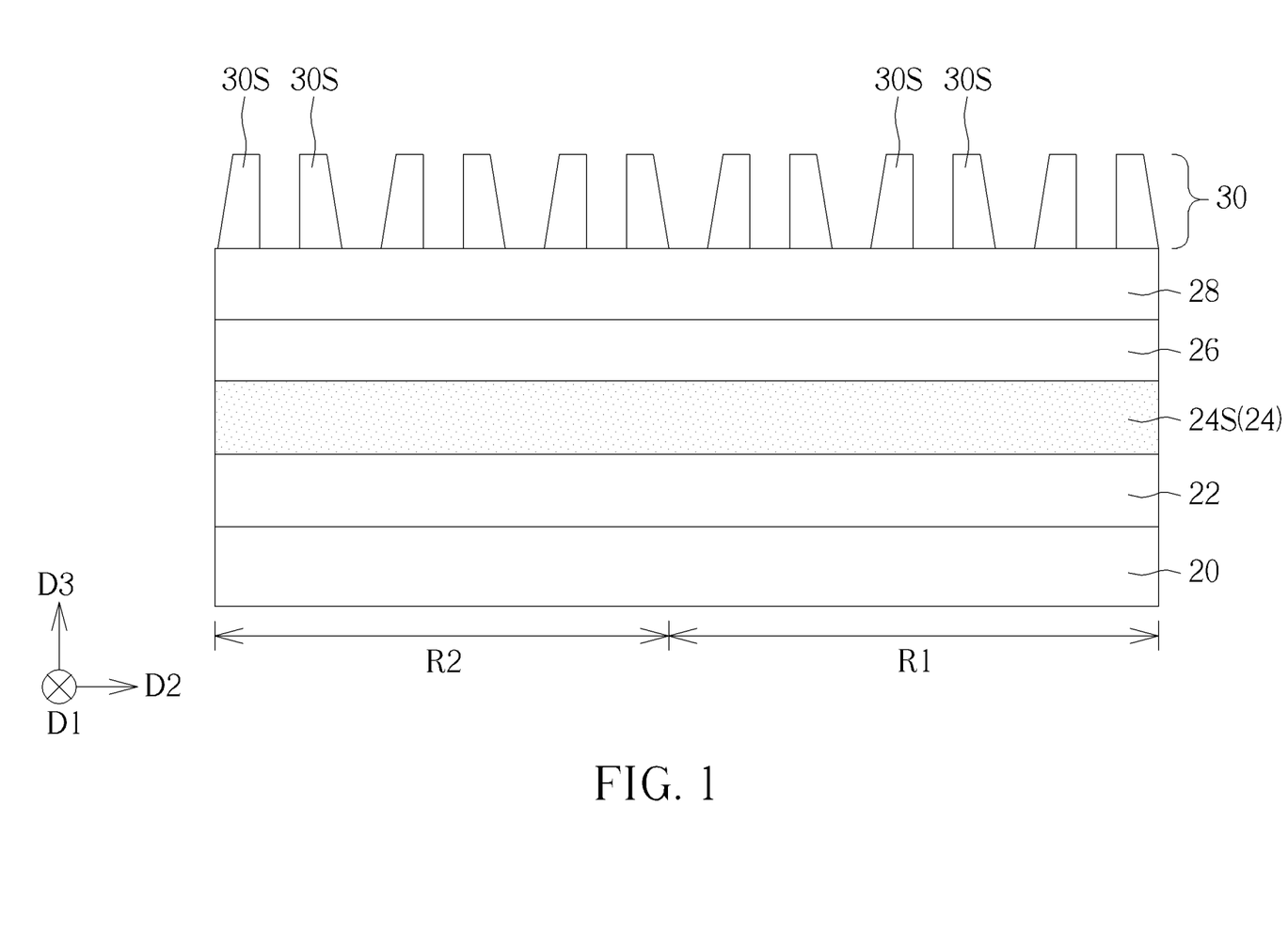
Figure 2:
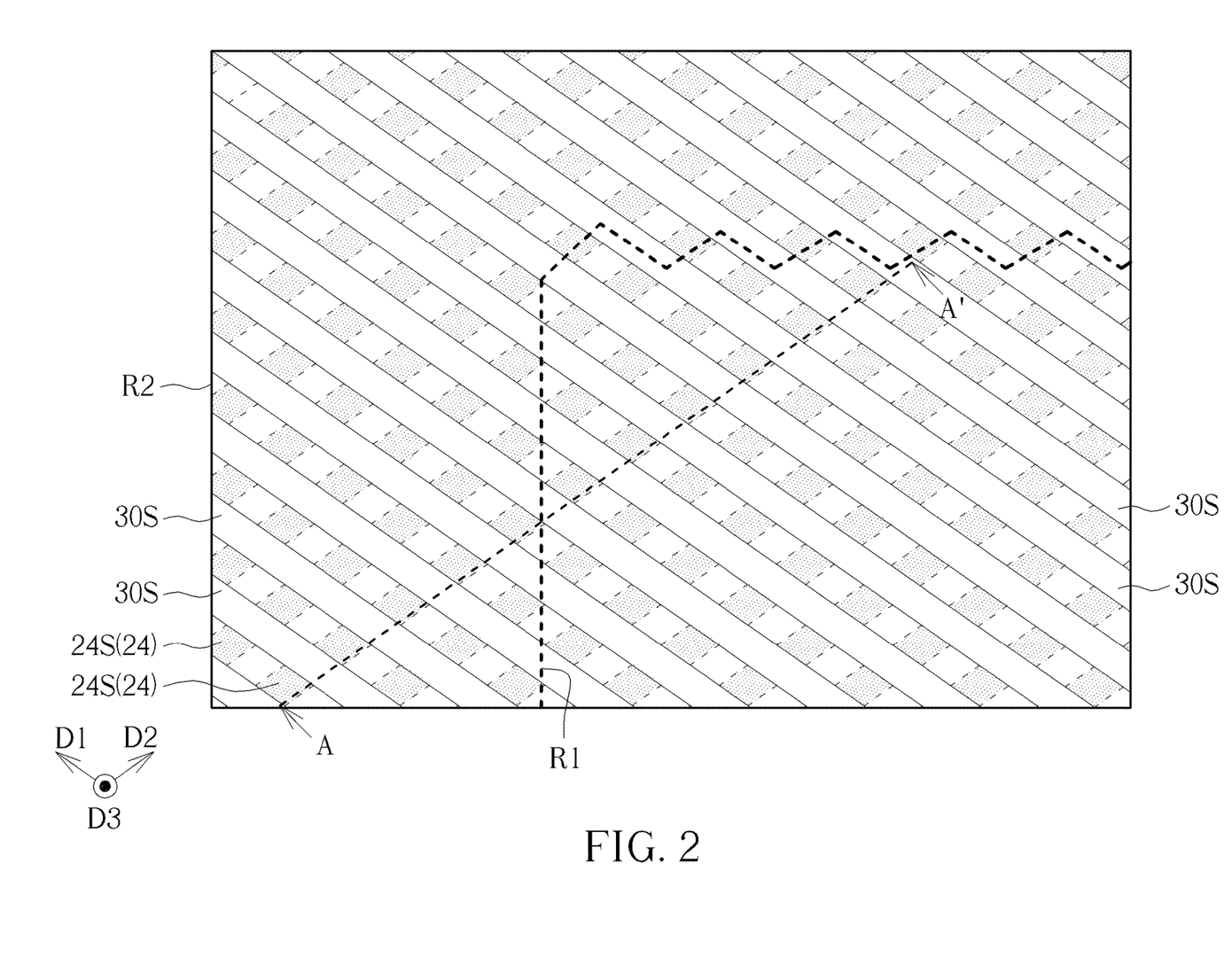
FIG. 2 is a top view schematic drawing corresponding to the condition of FIG. 1.
Figure 3:
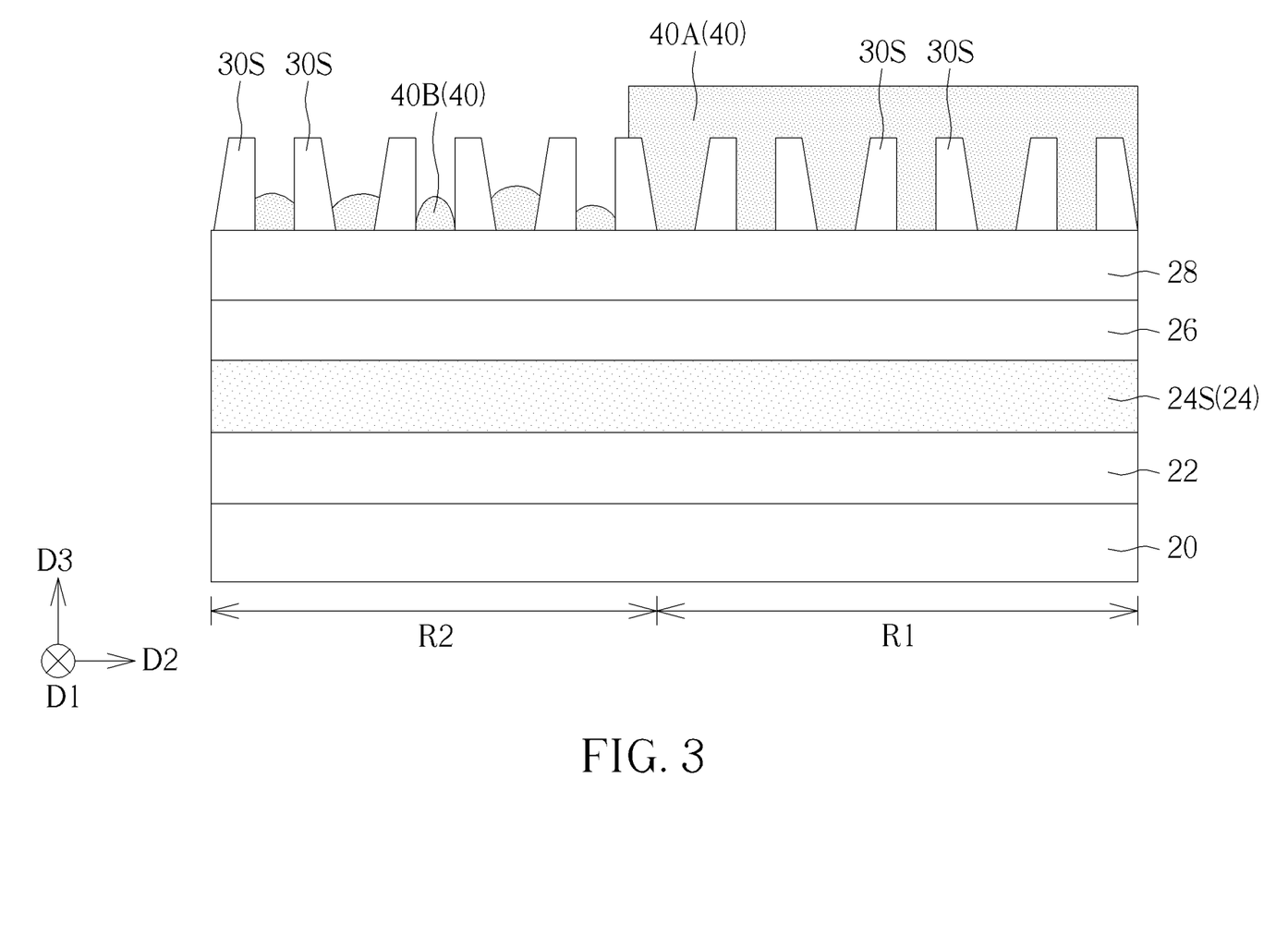
FIG. 3 is a schematic drawing in a step subsequent to FIG. 1.
Figure 4:
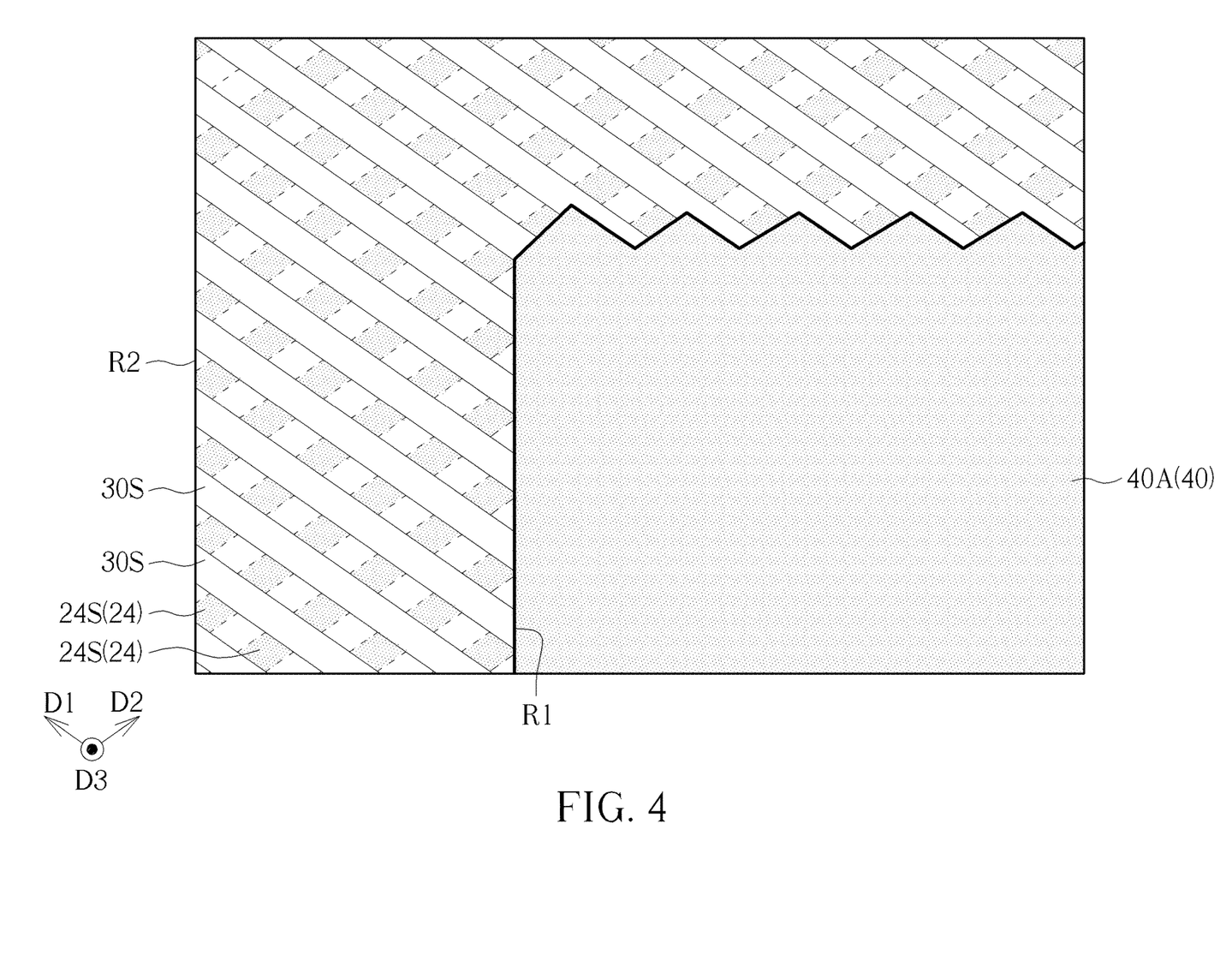
FIG. 4 is a top view schematic drawing corresponding to the condition of FIG. 3.
Figure 5:
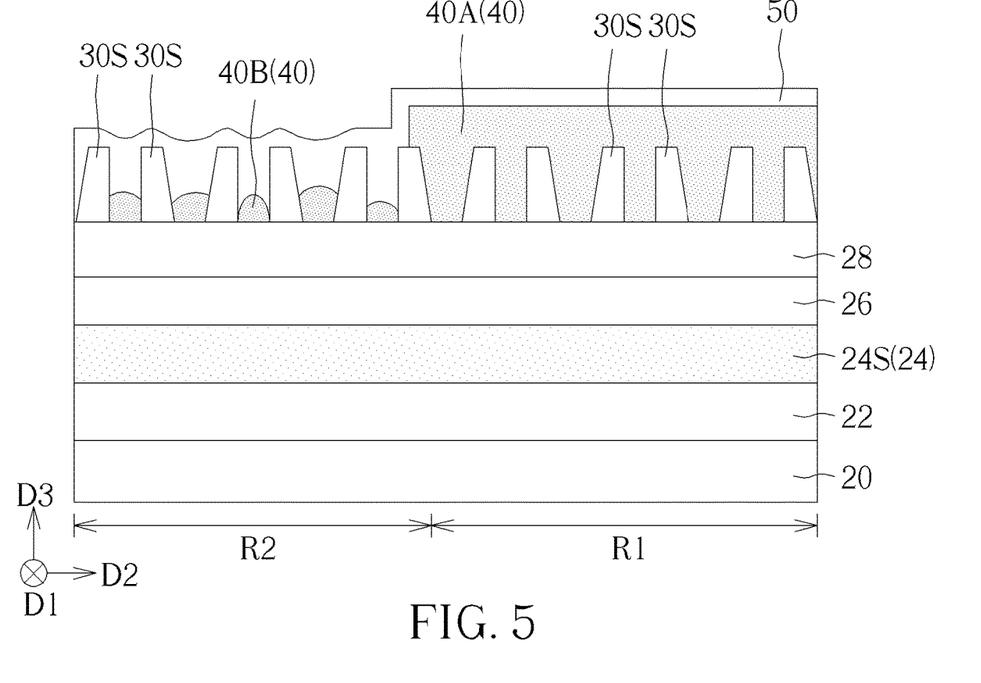
FIG. 5 is a schematic drawing in a step subsequent to FIG. 3.
Figure 6:
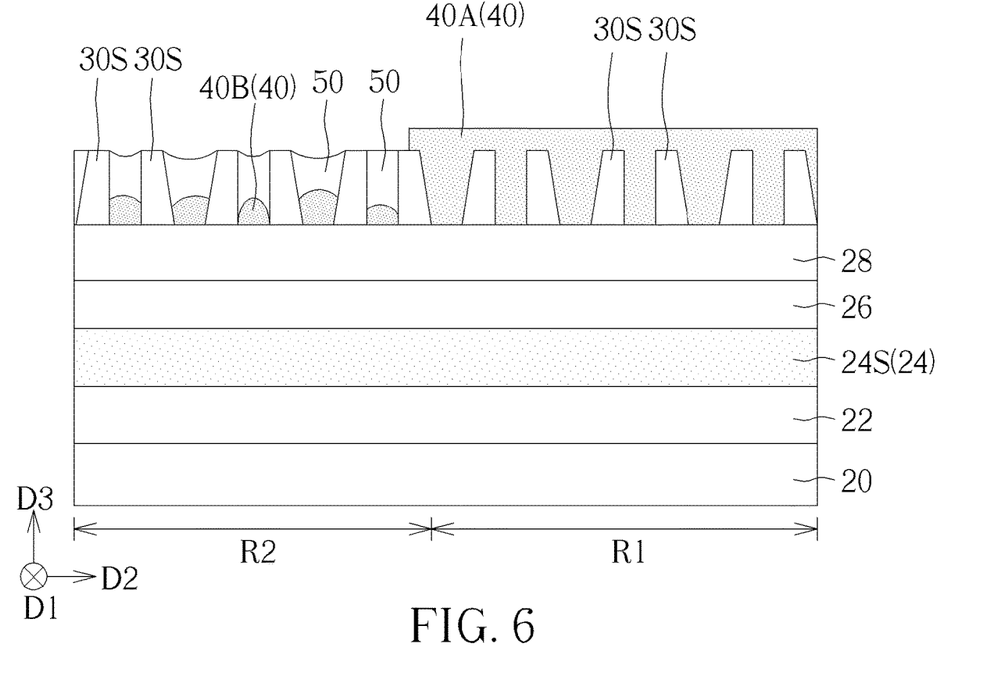
FIG. 6 is a schematic drawing in a step subsequent to FIG. 5.
Figure 7:
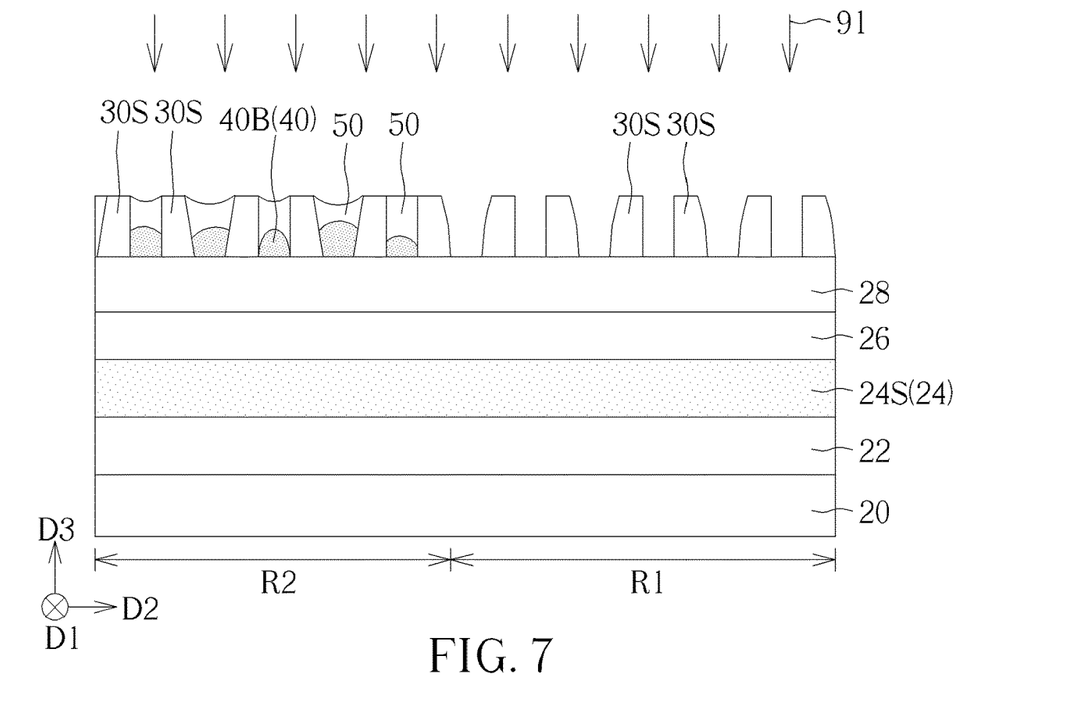
FIG. 7 is a schematic drawing in a step subsequent to FIG. 6.
Figure 8:
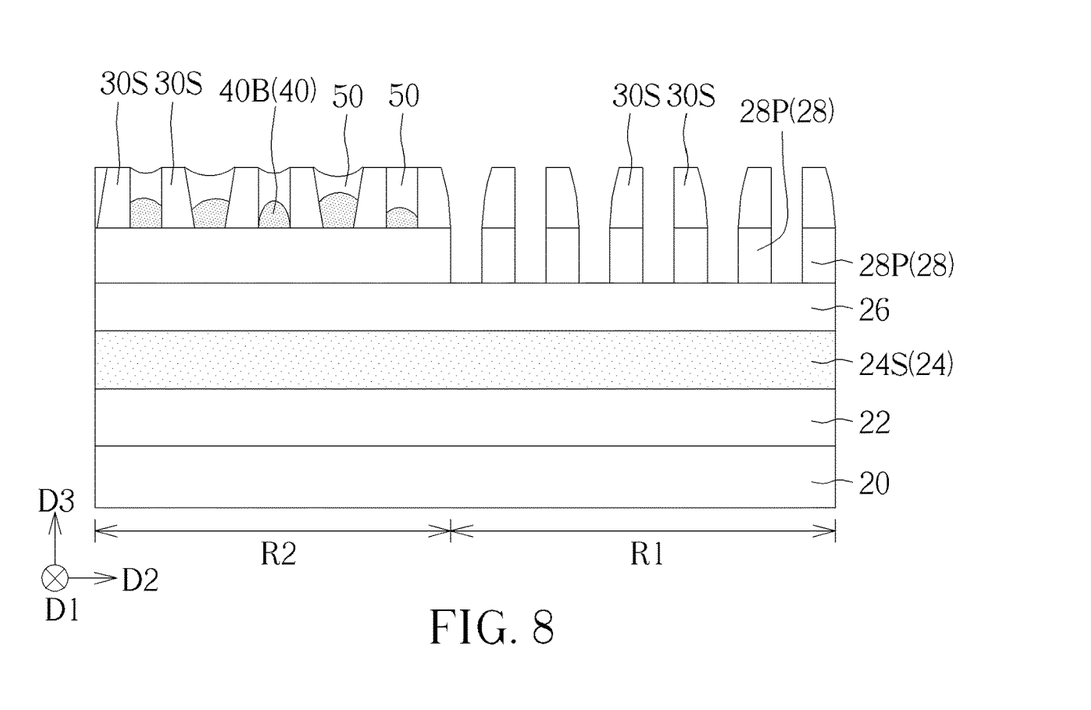
FIG. 8 is a schematic drawing in a step subsequent to FIG. 7.
Figure 9:
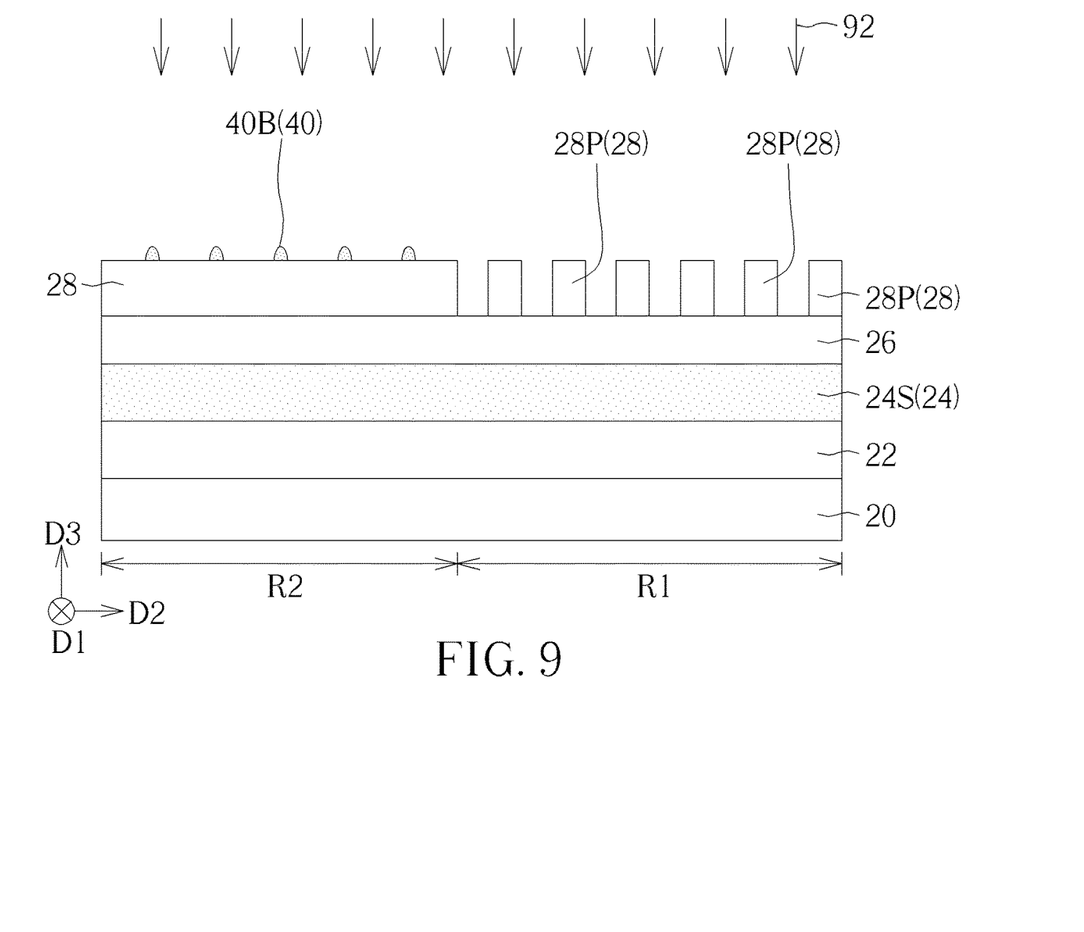
FIG. 9 is a schematic drawing in a step subsequent to FIG. 8.
Figure 10:
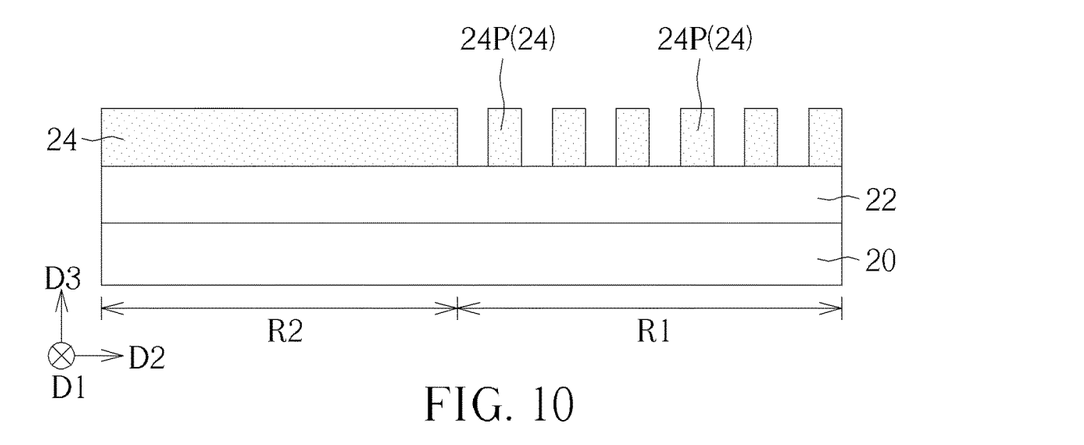
FIG. 10 is a schematic drawing in a step subsequent to FIG. 9.
Figure 11:
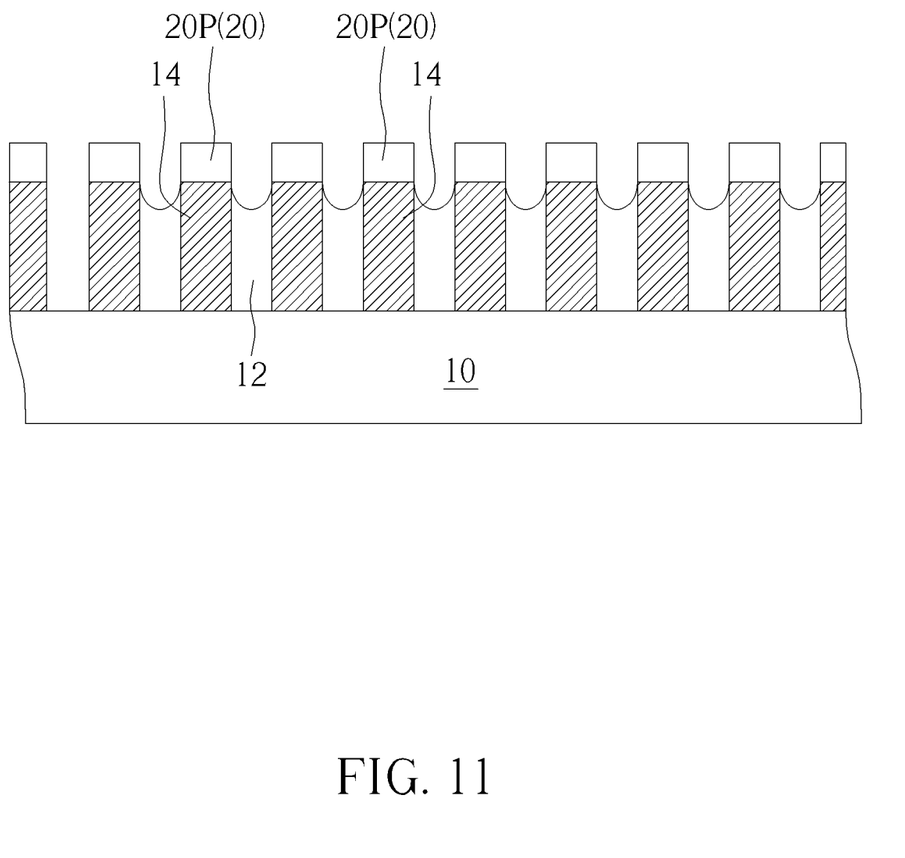
FIG. 11 is a schematic drawing in a step subsequent to FIG. 10.

Please refer to FIGS. 1-11. FIGS. 1-11 are schematic drawings illustrating a method of fabricating a patterned structure according to a first embodiment of the present invention, wherein FIG. 1, FIG. 3, and FIGS. 5-11 are cross-sectional diagrams, and FIG. 2 and FIG. 4 are top view diagrams. FIG. 1 may be regarded as a cross-sectional diagram taken along a cross-sectional line A-A' in FIG. 2, FIG. 2 is a top view schematic drawing corresponding to the condition of FIG. 1, FIG. 3 is a schematic drawing in a step subsequent to FIG. 1, FIG. 4 is a top view schematic drawing corresponding to the condition of FIG. 3, FIG. 5 is a schematic drawing in a step subsequent to FIG. 3, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, and FIG. 11 is a schematic drawing in a step subsequent to FIG. 10. The method of fabricating a patterned structure in this embodiment may include the following steps.

Firstly, as shown in FIG. 1 and FIG. 2, a pattern transfer layer (such as a first pattern transfer layer 28 shown in FIG. 1) is formed on a material layer (such as a first material layer 24 shown in FIG. 1). A first region R1 and a second region R2 may be defined on the first material layer 24, and the first pattern transfer layer 28 is formed above the first region R1 and the second region R2. In some embodiments, the first region R1 may be regarded as a region where the first material layer 24 is going to be patterned, and the second region R1 may be regarded as a region where the first material layer 24 is not going to be patterned. Subsequently, a plurality of first patterns 30S is formed on the first pattern transfer layer 28, and the first patterns 30S are formed above the first region R1 and the second region R2. In some embodiments, each of the first patterns 30S may be a stripe pattern elongated in a first direction D1, and the first patterns 30S may be disposed parallel to one another. A part of the first patterns 30S may be located above the first region R1, and another part of the first patterns 30S may be located above the second region R2. In some embodiments, the first patterns 30S may be formed by a sidewall image transfer technique. For example, a spacer material layer 30 may be formed conformally on a plurality of entity patterns (not shown) which are elongated in the same direction and parallel to one another, the spacer material layer 30 is then etched to form a plurality of spacers, and the entity patterns are removed for forming the first patterns 30S, but not limited thereto. The spacer material layer 30 and the first patterns 30S may include an insulation material, such as oxide insulation material or other suitable insulation materials or conductive materials capable of being formed conformally.

In some embodiments, other material layers may be formed between the first pattern transfer layer 28 and the first material layer 24. For instance, a second pattern transfer layer 26 may be disposed between the first pattern transfer layer 28 and the first material layer 24 in a thickness direction of the first material layer 24 (such as a third direction D3 shown in FIG. 1), but not limited thereto. Additionally, in some embodiments, the first material layer 24 may be formed above a second material layer 20, and a hard mask layer 22 may be disposed between the first material layer 24 and the second material layer 20 in the third direction D3. At least some of the material composition of the first patterns 30S, the material composition of the first pattern transfer layer 28, the material composition of the second pattern transfer layer 26, the material composition of the first material layer 24, the material composition of the hard mask layer 22, or the material composition of the second material layer 20 described above may be different from each other for providing required etching selectivity in the subsequent etching processes. For example, the first pattern transfer layer 28 may be a silicon oxynitride layer, the second pattern transfer layer 26 may be an organic dielectric layer (ODL), the first material layer 24 may be another silicon oxynitride layer, the hard mask layer 22 may be a silicon nitride layer, and the second material layer 20 may be a conductive layer, but not limited thereto. The first patterns 30S, the first pattern transfer layer 28, the second pattern transfer layer 26, the first material layer 24, the hard mask layer 22, and the second material layer 20 described above may include other suitable dielectric materials and/or other suitable conductive materials according to other considerations. Additionally, in some embodiments, the first material layer 24 may be a patterned material layer. For example, the first material layer 24 may include a plurality of second patterns 24S disposed on the hard mask layer 22. Each of the second patterns 24S may be a stripe pattern elongated in a second direction D2, and the second patterns 24S may be disposed parallel to one another. In some embodiments, as shown in FIG. 2, the first patterns 30S and the second patterns 24 may be crossed. In other words, the first direction D1 may be different from the second direction D2, and the first direction D1 may be orthogonal to the second direction D2 or not.

Subsequently, as shown in FIG. 3 and FIG. 4, a mask layer 40 is formed, and a first part 40A of the mask layer 40 covers the first patterns 30S above the first region R1. In some embodiments, the mask layer 40 may include a patterned photoresist layer or other suitable patterned material layers, and the mask layer 40 may directly contact the first patterns 30S and the first pattern transfer layer 28. In addition, the first part 40A of the mask layer 40 may completely cover the first patterns 30S above the first region R1, and a top surface of the first part 40A of the mask layer 40 may be higher than a top surface of each of the first patterns 30S in the third direction D3 accordingly. Additionally, in some embodiments, a second part 40B of the mask layer 40 may be formed between the first patterns 30S above the second region R2, and a top surface of the second part 40B of the mask layer 40 may be lower than the top surface of each of the first patterns 30S and the top surface of the first part 40A of the mask layer 40 in the third direction D3. The second part 40B of the mask layer 40 may be regarded as an unwanted residue of the mask layer 40. For example, when the mask layer 40 is a patterned photoresist layer, the first part 40A of the mask layer 40 may be regarded as a mask layer predetermined to be formed above the first region R1 by performing an exposure process and a development process to a photoresist material, and the second part 40B of the mask layer 40 may be regarded as photoresist residues of the photoresist material which are not removed completely after the exposure process and the development process and remain above the second region R2. In some embodiments, because the photoresist material described above may directly formed on the first patterns 30S and the first pattern transfer layer 28, the photoresist residues may be formed by the influence of the first patterns 30S when the step of removing the photoresist material above the second region R2. The photoresist residues tend to be formed especially when the critical dimension (CD) of the first pattern 30S is too small and the process window of the exposure process and the development process performed to the photoresist material becomes smaller accordingly, and the photoresist residues are hard to be avoided by over exposure and/or over develop.

As shown in FIG. 5, a first cap layer 50 is formed subsequently. The first cap layer 50 covers the first part 40A of the mask layer 40 above the first region R1 and the first patterns 30S above the second region R2. In some embodiments, the first cap layer 50 may be fully formed above the first region R1 and the second region R2, and the first cap layer 50 may cover the first pattern transfer layer 28 above the second region R2, the first patterns 30S above the second region R2, and the second part 40B of the mask layer 40. The material of the first cap layer 50 may be similar to the material of the first patterns 30S for removing the first cap layer 50 and the first patterns 30S concurrently by the same etching approach in the subsequent process, but not limited thereto. In some embodiments, the first cap layer 50 and the first patterns 30S may also be formed by different materials respectively according to some considerations.

As shown in FIG. 5 and FIG. 6, the first cap layer 50 covering the first part 40A of the mask layer 40 is removed for exposing the first part 40A of the mask layer 40 above the first region R1. Subsequently, as shown in FIG. 6 and FIG. 7, the first part of the mask layer is removed, and a first etching process 91 is performed to the first pattern transfer layer 28 with the first patterns 30S above the first region R1 as a mask after removing the first part 40A of the mask layer 40. It is worth noting that, in some embodiments, the first pattern transfer layer 28 formed above the second region R2 may be covered by the first cap layer 50 and the first patterns 30S above the second region R2 during the step of removing the first part 40A of the mask layer 40, and the second part 40B of the mask layer 40 located between the first patterns 30S may be covered by the first cap layer 50 during the step of removing the first part 40A of the mask layer 40. Therefore, in the first etching process 91, the first pattern transfer layer 28 above the second region R2 may be covered by the first patterns 30S, the first cap layer 50 and the second part 40B of the mask layer 40 and will not be etched by the first etching process 91.

As shown in FIG. 7 and FIG. 8, the first pattern transfer layer 28 formed above the first region R1 may be patterned to be a plurality of transferred patterns 28P by the first etching process 91, and the shape of the transferred patterns 28P may be substantially the same as the shape of the first patterns 30S above the first region R1. In other words, the first etching process 91 may be used to transfer the first patterns 30 into the first pattern transfer layer 28. Additionally, in some embodiments, the first pattern transfer layer 28 formed above the second region R2 may be still covered by the first cap layer 50, the second part 40B of the mask layer 40, and the first patterns 30S above the second region R2 after the first etching process 91, but not limited thereto.

Subsequently, as shown in FIG. 8 and FIG. 9, the first patterns 30S and the first cap layer 50 may be completely removed, and a second etching process 92 may be performed to the first material layer 24 with the transferred patterns 28P and the first pattern transfer layer 28 formed above the second region R2 as a mask after the step of removing the first patterns 30S and the first cap layer 50. In other words, as shown in FIGS. 7-9, the first patterns 30S and the first cap layer 50 may be removed after the first etching process 91 and before the second etching process 92. In some embodiments, a part of the mask layer 40 may still remain on the first pattern transfer layer 28 above the second region R2 after the step of removing the first patterns 30S and the first cap layer 50 because the material of the mask layer 40 is different from the material of the first patterns 30S and the material of the first cap layer 50, but the performance of the second etching process 92 will not be influenced by this remainder.

Subsequently, as shown in FIG. 9 and FIG. 10, the first material layer 24 above the first region R1 may be patterned to be a plurality of third patterns 24P by the second etching process 92. In some embodiments, the third patterns 24P may be formed corresponding to the areas shown in FIG. 2 where the first patterns 30S above the first region R1 overlap the second patterns 24S above the first region R1 in the third direction D3, and the third patterns 24P may be distributed as blocks, but not limited thereto. Additionally, in some embodiments, the second etching process 92 may include etching steps for etching the second pattern transfer layer 26 and the first material layer 24 respectively. The transferred patterns 28P and the first pattern transfer layer 28 may be removed concurrently by etching the first material layer 24 with the etched second pattern transfer layer 26 as a mask especially when the material composition of the first pattern transfer layer 28 is similar to the material composition of the first material layer 24, but not limited thereto. In some embodiments, the second pattern transfer layer 26 may be removed after the second etching process 92, and the first pattern transfer layer 28 and the transferred patterns 28P may also be removed after the second etching process 92 according to some considerations. As shown in FIGS. 5-10, the step of removing the first cap layer 50 on the first part 40A of the mask layer 40, the step of removing the first part 40A of the mask layer 40, the first etching process 91, the step of removing the first cap layer 50 and the first patterns 30S, and the second etching process 92 described above may be dry etching steps respectively and may be performed successively in the same etching apparatus and/or the same etching chamber preferably for reducing the influence of external environment, but not limited thereto.

As shown in FIG. 10 and FIG. 11, in some embodiments, the third patterns 24P may be the target patterned structure formed by the fabricating process of the present invention. In some embodiments, the third patterns 24P may be used as a mask for patterning the second material layer 20 under the third patterns 24P, and the second material layer 20 above the first region R1 may be patterned to be a plurality of fourth patterns 20P. For example, an etching process may be used to transfer the third patterns 24P into the hard mask layer 22, and the etched hard mask layer 22 may be used as an etching mask for patterning the second material layer 20, but not limited thereto. Additionally, in some embodiments, the second material layer 20 may be disposed on a substrate 10, and a dielectric layer 12 and a plurality of contact plugs 14 may be disposed between the substrate 10 and the second material layer 20. The fourth patterns 20P formed by the fabricating method described above may be formed corresponding to different contact plugs 14. For instance, when the fabricating method of the present invention is applied to forma semiconductor memory device, such as a dynamic random access memory (DRAM) device, the substrate 10 may include a semiconductor substrate, a plurality of transistor structures (not shown) and wirings, such as word lines, may be formed in the substrate 10, and a plurality of bit line structures (not shown) and the contact plugs 14 may be formed in the dielectric layer 12 above the substrate 10. Therefore, the fourth patterns 20P formed corresponding to the contact plugs 14 may be storage node contact pads, and the first region R1 and the second region R2 described above maybe a memory cell region and a peripheral region respectively, but not limited thereto.

As shown in FIGS. 1-8, the fabricating method in this embodiment may be regarded as a trimming process performed to the first patterns 30S and the second patterns 24S, and the influence of the photoresist residues (such as the second part 40B of the mask layer 40) on the etching process may be avoided because the main portion of the mask layer 40 (i.e. the first part 40A) covers the first region R1 that is supposed to be patterned by the patterning process instead of covering the second region R2 that is not supposed to be patterned by the patterning process. In addition, the influence of process variations in the step of forming the mask layer 40 (such as the first part 40A extending to be located above some area of the second region R2) on the patterning performance may be avoided by the first cap layer 50 covering the mask layer 40 (including the first part 40A and the second part 40B) and the first patterns 30S above the second region R2, and the process window of the mask layer 40 may be enhanced accordingly.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 12:
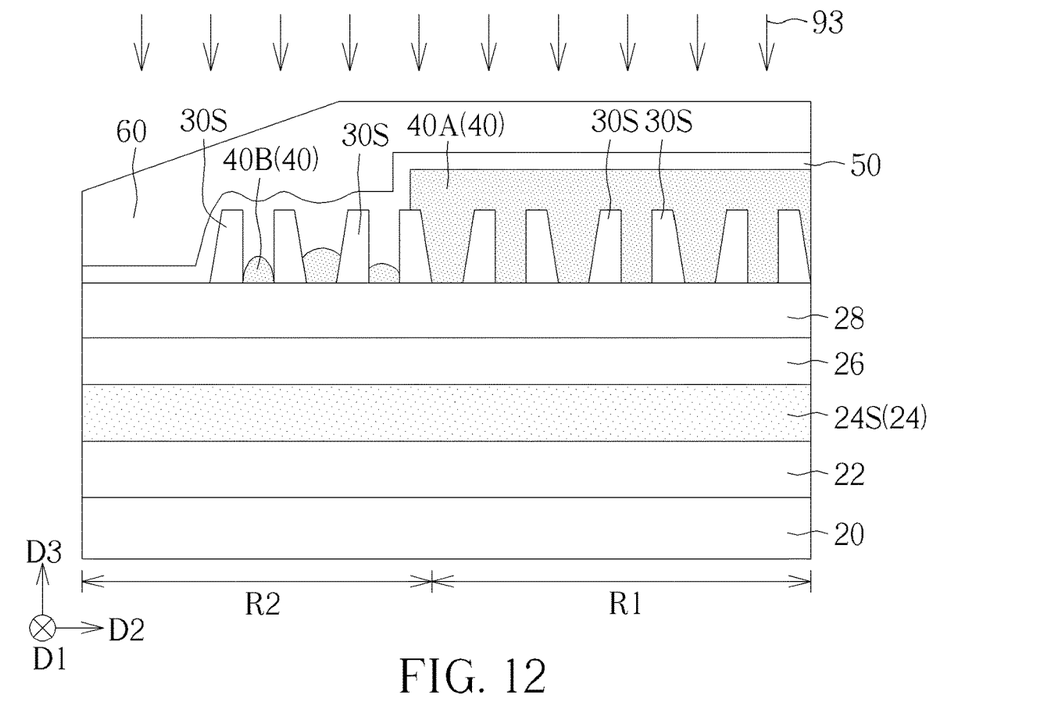
Figure 13:
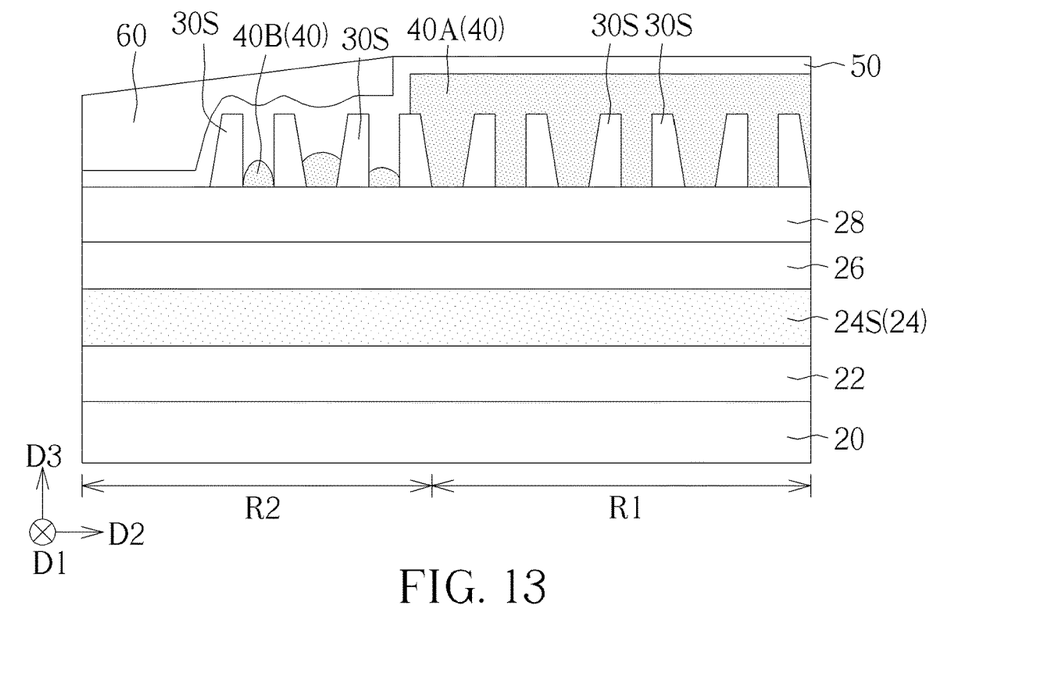
FIG. 13 is a schematic drawing in a step subsequent to FIG. 12.
Figure 14:
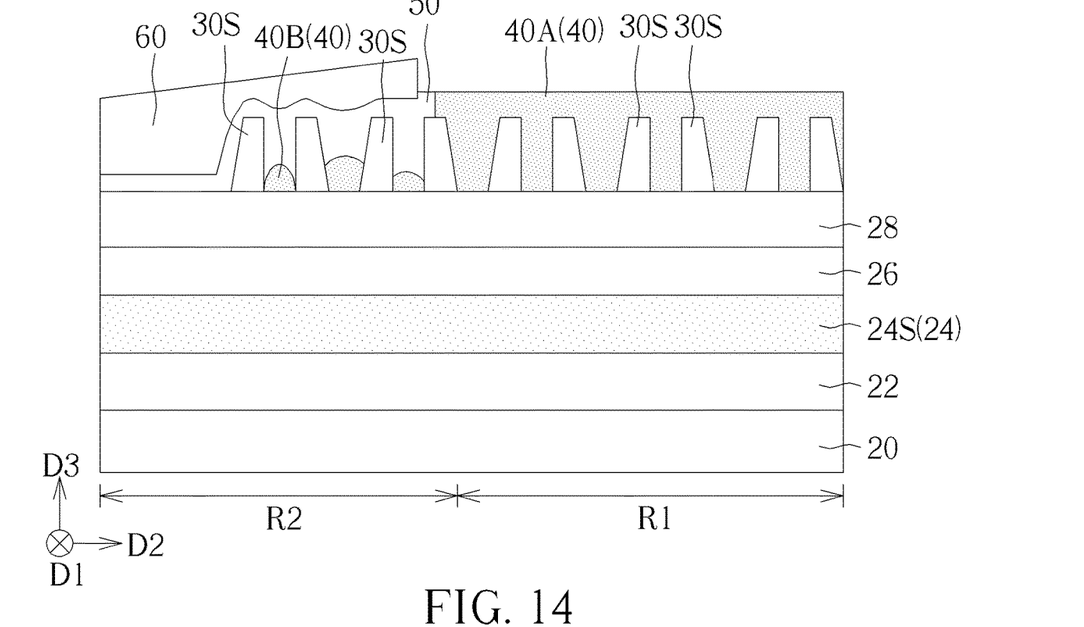
FIG. 14 is a schematic drawing in a step subsequent to FIG. 13.
Figure 15:
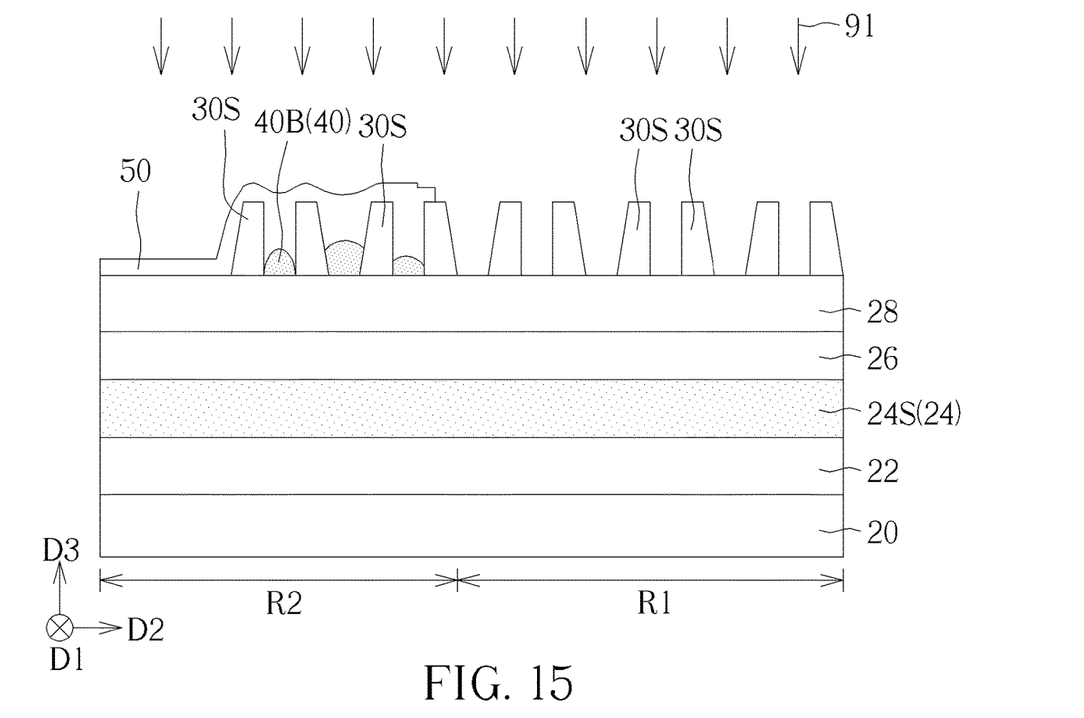
FIG. 15 is a schematic drawing in a step subsequent to FIG. 14.

Please refer to FIGS. 12-15. FIGS. 12-15 are schematic drawings illustrating a method of fabricating a patterned structure according to a second embodiment of the present invention, wherein FIG. 13 is a schematic drawing in a step subsequent to FIG. 12, FIG. 14 is a schematic drawing in a step subsequent to FIG. 13, and FIG. 15 is a schematic drawing in a step subsequent to FIG. 14. As shown in FIGS. 12-14, the fabricating method in this embodiment may further include forming a second cap layer 60 on the first cap layer 50 before the step of removing the first cap layer 50 covering the first part 40A of the mask layer 40, and the second cap layer 60 is formed above the first region R1 and the second region R2. In addition, the second cap layer 60 above the first region R1 may be removed for exposing the first cap layer 50 above the first region R1 before the step of removing the first cap layer 50 covering the first part 40A of the mask layer 40 (such as the condition shown in FIG. 13). In other words, the second cap layer 60 covering the first cap layer 50 above the first region R1 may be removed first in the fabricating method in this embodiment, and the first cap layer 50 covering the first part 40A of the mask layer 40 is removed subsequently.

In some embodiments, the first cap layer 50 above the first region R1 may be higher than the first cap layer 50 above the second region R2, the second cap layer 60 above the second region R2 may be thicker than the second cap layer 60 above the first region R1, and an etching back process 93 may be performed to the second cap layer 60 above the first region R1 and the second region R2 for removing the second cap layer 60 above the first region R1 and keeping the second cap layer 60 above the second region R2, but not limited thereto. Therefore, the second cap layer 60 may still cover at least a part of the first cap layer 50 above the second region R2 after the step of removing the second cap layer 60 above the first region R1. For the process purpose described above, the material composition of the second cap layer 60 may be different from the material composition of the first cap layer 50 preferably for improving the etching selectivity in the etching back process 93. For example, the first cap layer 50 may be a silicon oxide layer, and the second cap layer 60 may be an organic dielectric layer, but not limited thereto.

As shown in FIGS. 13-15, after the step of removing the first cap layer 50 covering the first part 40A of the mask layer 40, the first part 40A of the mask layer 40 may be removed, and the first etching process 91 is performed subsequently. In some embodiments, the second cap layer 60 above the second region R2 may be removed before the first etching process 91. In some embodiments, the second cap layer 60 above the second region R2 and the first part 40A of the mask layer 40 may be removed concurrently especially when the material composition of the second cap layer 60 is similar to the material composition of the mask layer 40, but not limited thereto. In addition, it is worth noting that, in some embodiments, the first cap layer 50 may directly contact a part of the first pattern transfer layer 28 above the second region R2 because the first pattern transfer layer 28 above the second region R2 is not completely covered by the first patterns 30 and/or the second part 40B of the mask layer 40. Therefore, defects generated in the subsequent process when the first pattern transfer layer 28 above the second region R2 is exposed by the step of removing the first cap layer 50 above the first region R1 may be avoided by the second cap layer 60 covering the first cap layer 50 above the second region R2. Additionally, as shown in FIGS. 12-15, in some embodiments, the etching back process 93, the step of removing the first cap layer 50 on the first part 40A of the mask layer 40, the step of removing the first part 40A of the mask layer 40, and the first etching process 91 described above may be dry etching steps respectively and may be performed successively in the same etching apparatus and/or the same etching chamber preferably for reducing the influence of external environment, but not limited thereto.

To summarize the above descriptions, in the method of fabricating the patterned structure according to the present invention, because the main portion of the mask layer covers the first region that is supposed to be patterned by the patterning process instead of covering the second region that is not supposed to be patterned by the patterning process, the residues of the mask layer may be located on the second region and covered by the first cap layer, and the influence of the residues of the mask layer on the etching process performed to the first region may be avoided accordingly. In addition, the influence of the location shift of the first part of the mask layer, which may be generated by process variations, on the patterning performance may be avoided also because the first cap layer covers the mask layer and the first patterns above the second region. The process window of the mask layer may be enhanced accordingly, and that is beneficial to improve the total manufacturing yield.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a patterned structure, comprising:
   forming a pattern transfer layer on a material layer, wherein a first region and a second region are defined on the material layer, and the pattern transfer layer is formed above the first region and the second region;
   forming a plurality of first patterns on the pattern transfer layer, wherein the first patterns are formed above the first region and the second region;
   forming a mask layer, wherein a first part of the mask layer covers the first patterns above the first region;
   forming a first cap layer covering the first part of the mask layer above the first region and the first patterns above the second region;
   removing the first cap layer covering the first part of the mask layer for exposing the first part of the mask layer above the first region;
   removing the first part of the mask layer; and
   performing a first etching process to the pattern transfer layer with the first patterns above the first region as a mask after removing the first part of the mask layer, wherein the pattern transfer layer formed above the second region is covered by the first cap layer and the first patterns above the second region during the step of removing the first part of the mask layer.

2. The method of fabricating the patterned structure according to claim 1, wherein the pattern transfer layer formed above the second region is covered by the first cap layer and the first patterns above the second region after the first etching process.

3. The method of fabricating the patterned structure according to claim 1, wherein a second part of the mask layer is formed between the first patterns above the second region, and the second part of the mask layer is covered by the first cap layer during the step of removing the first part of the mask layer.

4. The method of fabricating the patterned structure according to claim 3, wherein the pattern transfer layer formed above the second region is covered by the second part of the mask layer and the first patterns above the second region after the first etching process.

5. The method of fabricating the patterned structure according to claim 3, wherein the mask layer comprises a patterned photoresist layer, and the second part of the mask layer comprises photoresist residues.

6. The method of fabricating the patterned structure according to claim 3, wherein a top surface of the second part of the mask layer is lower than a top surface of the first part of the mask layer in a thickness direction of the material layer.

7. The method of fabricating the patterned structure according to claim 6, wherein the top surface of the second part of the mask layer is lower than a top surface of each of the first patterns in the thickness direction of the material layer.

8. The method of fabricating the patterned structure according to claim 1, wherein the pattern transfer layer formed above the first region is patterned to be a plurality of transferred patterns by the first etching process, and the method of fabricating the patterned structure further comprises:
   performing a second etching process to the material layer with the transferred patterns and the pattern transfer layer formed above the second region as a mask.

9. The method of fabricating the patterned structure according to claim 8, further comprising:
   removing the first patterns and the first cap layer after the first etching process and before the second etching process.

10. The method of fabricating the patterned structure according to claim 1, further comprising:
    forming a second cap layer on the first cap layer before the step of removing the first cap layer covering the first part of the mask layer, wherein the second cap layer is formed above the first region and the second region.

11. The method of fabricating the patterned structure according to claim 10, further comprising:
    removing the second cap layer above the first region for exposing the first cap layer above the first region before the step of removing the first cap layer covering the first part of the mask layer.

12. The method of fabricating the patterned structure according to claim 11, wherein the second cap layer above the first region is removed by an etching back process performed to the second cap layer above the first region and the second region.

13. The method of fabricating the patterned structure according to claim 11, wherein the second cap layer covers at least a part of the first cap layer above the second region after the step of removing the second cap layer above the first region.

14. The method of fabricating the patterned structure according to claim 13, further comprising:
    removing the second cap layer above the second region before the first etching process.

15. The method of fabricating the patterned structure according to claim 14, wherein the second cap layer above the second region and the first part of the mask layer are removed concurrently.

16. The method of fabricating the patterned structure according to claim 10, wherein a material composition of the second cap layer is different from a material composition of the first cap layer.

17. The method of fabricating the patterned structure according to claim 10, wherein the first cap layer directly contacts a part of the pattern transfer layer above the second region.

18. The method of fabricating the patterned structure according to claim 1, wherein the first patterns are parallel with one another.

19. The method of fabricating the patterned structure according to claim 18, wherein the material layer comprises a plurality of second patterns parallel with one another, and the first patterns and the second patterns are crossed.

* * * * *